United States Patent
Luo et al.

(10) Patent No.: US 10,760,160 B2
(45) Date of Patent: *Sep. 1, 2020

(54) SHOWERHEAD TILT MECHANISM

(71) Applicant: LAM RESEARCH CORPORATION, Fremont, CA (US)

(72) Inventors: Bin Luo, Beaverton, OR (US); Timothy Scott Thomas, Wilsonville, OR (US); Damien Slevin, Salem, OR (US); David Kamp, Wilsonville, OR (US)

(73) Assignee: Lam Research Corporation, Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/257,603

(22) Filed: Jan. 25, 2019

(65) Prior Publication Data
US 2019/0153601 A1 May 23, 2019

Related U.S. Application Data

(63) Continuation of application No. 15/658,911, filed on Jul. 25, 2017, now Pat. No. 10,190,216.

(51) Int. Cl.
*H01L 21/67* (2006.01)
*C23C 16/455* (2006.01)
*C23C 16/50* (2006.01)
*C23C 16/458* (2006.01)
*C23C 16/44* (2006.01)
(Continued)

(52) U.S. Cl.
CPC .... *C23C 16/45565* (2013.01); *C23C 16/4409* (2013.01); *C23C 16/458* (2013.01); *C23C 16/50* (2013.01); *C23C 16/505* (2013.01); *H01L 21/02274* (2013.01)

(58) Field of Classification Search
CPC ..... C23C 16/455; C23C 16/458; H01L 21/67; H01L 21/306
See application file for complete search history.

(56) References Cited

U.S. PATENT DOCUMENTS

| 4,234,177 A | 11/1980 | McDougal |
| 4,384,918 A | 5/1983 | Abe |

(Continued)

FOREIGN PATENT DOCUMENTS

| WO | 2008011306 A2 | 1/2008 |
| WO | WO-2019022978 A1 | 1/2019 |

OTHER PUBLICATIONS

"U.S. Appl. No. 15/658,911, 312 Amendment filed Dec. 3, 2018", 8 pgs.

(Continued)

*Primary Examiner* — Robert M Kunemund
(74) *Attorney, Agent, or Firm* — Schwegman Lundberg & Woessner, P.A.

(57) ABSTRACT

A showerhead tilt adjustment mechanism is provided which supports a showerhead module in a top plate of a semiconductor substrate processing apparatus, the showerhead tilt adjustment mechanism including a differential screw which provides coarse and fine adjustments to adjust gap/tilt/planarization of a faceplate of the showerhead module with respect to an upper surface of a substrate pedestal module adjacent the faceplate in the semiconductor substrate processing apparatus.

20 Claims, 5 Drawing Sheets

(51) Int. Cl.
*C23C 16/505* (2006.01)
*H01L 21/02* (2006.01)

(56) References Cited

U.S. PATENT DOCUMENTS

| | | | |
|---|---|---|---|
| 5,151,845 | A | 9/1992 | Watanabe et al. |
| 5,522,398 | A | 6/1996 | Goldenberg et al. |
| 5,751,537 | A | 5/1998 | Kumar |
| 6,431,112 | B1 | 8/2002 | Sill et al. |
| 6,630,053 | B2 | 10/2003 | Yamagishi et al. |
| 7,790,229 | B2 | 9/2010 | Floyd |
| 8,431,033 | B2 | 4/2013 | Zhou et al. |
| 8,498,093 | B2 | 7/2013 | Nishioka |
| 8,557,712 | B1 | 10/2013 | Antonelli et al. |
| 8,580,697 | B1 | 11/2013 | Lang et al. |
| 8,747,560 | B2 | 6/2014 | Collins et al. |
| 9,290,843 | B2 | 3/2016 | Madsen |
| 10,190,216 | B1 * | 1/2019 | Luo ................ C23C 16/50 |
| 2006/0000411 | A1 | 1/2006 | Seo et al. |
| 2008/0036480 | A1 | 2/2008 | Hobbs et al. |
| 2008/0099146 | B1 | 5/2008 | Keller |
| 2008/0286444 | A1 | 11/2008 | Floyd et al. |
| 2009/0120584 | A1 | 5/2009 | Lubomirsky |
| 2009/0199766 | A1 | 8/2009 | Tappan |
| 2009/0260571 | A1 | 10/2009 | Ostrowski et al. |
| 2010/0003829 | A1 | 1/2010 | Patrick et al. |
| 2010/0108843 | A1 | 5/2010 | Shaffer |
| 2010/0247234 | A1 | 9/2010 | Closs |
| 2010/0294199 | A1 | 11/2010 | Tran |
| 2012/0227665 | A1 | 9/2012 | Ozgun et al. |
| 2013/0005140 | A1 | 1/2013 | Jeng |
| 2013/0027838 | A1 | 1/2013 | Hori |
| 2013/0230987 | A1 | 9/2013 | Draeger |
| 2013/0316094 | A1 | 11/2013 | Leeser |
| 2013/0319329 | A1 | 12/2013 | Li |
| 2015/0120216 | A1 | 4/2015 | Vukkadala et al. |
| 2015/0225854 | A1 | 8/2015 | Madsen |
| 2016/0005574 | A1 | 1/2016 | Liu |
| 2016/0283625 | A1 | 9/2016 | Vukkadala |
| 2017/0092531 | A1 | 3/2017 | Coomer |
| 2017/0191160 | A1 | 7/2017 | Wiltse |
| 2019/0032214 | A1 | 1/2019 | Luo et al. |

OTHER PUBLICATIONS

"U.S. Appl. No. 15/658,911, Notice of Allowance dated Sep. 12, 2018", 8 pgs.

"U.S. Appl. No. 15/658,911, PTO Response to 312 Communication dated Dec. 21, 2018", 2 pgs.

"International Application Serial No. PCT/US2018/042214, International Search Report dated Nov. 28, 2018", 3 pgs.

"International Application Serial No. PCT/US2018/042214, Written Opinion dated Nov. 28, 2018", 8 pgs.

International Application Serial No. PCT/US2018/042214, International Preliminary Report on Patentability dated Feb. 6, 2020, 10 pgs.

* cited by examiner

SHOWERHEAD TILT MECHANISM

CROSS REFERENCE TO RELATED APPLICATION

This application is a continuation patent application of U.S. patent application Ser. No. 15/658,911, filed Jul. 25, 2017 now U.S. Pat. No. 10,190,216, the entire content of which is incorporated herein by reference.

FIELD OF INVENTION

This invention pertains to semiconductor substrate processing apparatuses used for processing semiconductor substrates, and may find particular use in performing chemical vapor depositions of thin films.

BACKGROUND

Semiconductor substrate processing apparatuses are used to process semiconductor substrates by techniques including, physical vapor deposition (PVD), chemical vapor deposition (CVD), plasma enhanced chemical vapor deposition (PECVD), atomic layer deposition (ALD), plasma enhanced atomic layer deposition (PEALD), pulsed deposition layer (PDL), molecular layer deposition (MLD), plasma enhanced pulsed deposition layer (PEPDL) processing, etching, and resist removal. One type of semiconductor substrate processing apparatus used to process semiconductor substrates includes a reaction chamber containing a showerhead module and a substrate pedestal module which supports the semiconductor substrate in the reaction chamber. The showerhead module delivers process gas into the reactor chamber so that the semiconductor substrate may be processed. In such chambers installation and removal of the showerhead module can be time consuming, and further, non-uniform film deposition (i.e. azimuthal variation) during substrate processing can occur if a lower surface of the showerhead module is not parallel to an upper surface of the substrate pedestal module.

SUMMARY

Disclosed herein is a semiconductor substrate processing apparatus for processing semiconductor substrates comprising (a) a chemical isolation chamber in which individual semiconductor substrates are processed, the chemical isolation chamber including a top plate forming an upper wall of the chemical isolation chamber, (b) a process gas source in fluid communication with the chemical isolation chamber for supplying at least one process gas into the chemical isolation chamber, (c) a showerhead module which delivers the process gas from the process gas source to a processing zone of the processing apparatus wherein the individual semiconductor substrates are processed, the showerhead module including a base attached to a lower end of a stem wherein a faceplate having gas passages therethrough forms a lower surface of the base and the stem extends through a vertically extending bore in the top plate, (d) a substrate pedestal module configured to support the semiconductor substrate in the processing zone below the faceplate during processing of the substrate, (e) a bellows assembly supporting the showerhead module, the bellows assembly including a collar, a bellows and a leveling plate, the collar having a central opening aligned with the bore in the top plate, the bellows surrounding the central opening in the collar and having a lower end attached to an upper surface of the collar and an upper end attached to a lower surface of the leveling plate, the leveling plate having a central opening aligned with the bore in the top plate, and (f) at least one showerhead tilt adjustment mechanism operable to adjust tilting of the faceplate of the showerhead module with respect to an upper surface of the substrate pedestal module adjacent the faceplate, wherein the showerhead tilt adjustment mechanism comprises a lock screw, a hollow screw, a lock plate, and a lock nut, the hollow screw having a first threaded section on an outer surface thereof and a second threaded section on the outer surface, the first threaded section having a thread pitch which is different than a thread pitch of the second threaded section, the first threaded section engaged with an internally threaded bore of the leveling plate, the second threaded section engaged with an internal thread of the locking nut, the lock screw having a lower external threaded section engaged with a threaded bore in the collar and an upper screw head engaging a shoulder of an upper socket in the hollow screw, and the lock plate movable from a first position at which the lock nut rotates with the hollow screw to a second position at which the lock nut cannot rotate, the showerhead tilt adjustment mechanism providing coarse adjustment when the lock plate is in the first position and fine adjustment when the lock plate is in the second position.

The at least one showerhead tilt adjustment mechanism preferably comprises three showerhead tilt adjustment mechanisms spaced outwardly of the bellows at locations 120° apart. The lock plate can be movable in a radial direction between the first and second positions and/or the leveling plate can include an upwardly extending tubular section wherein an inner surface of the tubular section includes the threaded bore. The lock plate can include a handle at an outer end thereof extending outwardly of the collar, a wide slot at an inner end thereof which can engage the lock nut, and a narrow slot extending outward from the wide slot, and a lock plate screw extending through the narrow slot and threaded into the collar, the lock plate screw having a screw head which can be tightened against the lock plate to prevent movement of the lock plate. In a preferred embodiment, the showerhead tilt adjustment mechanism can provide a coarse gap adjustment of about 0.02 to about 0.04 inch per full rotation of the hollow screw when the lock plate is in the first position and a fine gap adjustment of about 0.002 to about 0.004 inch per full rotation of the hollow screw when the lock plate is in the second position.

In an embodiment, a method of controlling in-plane distortion (IPD) due to showerhead tilt in a semiconductor substrate processing apparatus comprises (a) measuring IPD changes across a wafer processed in a processing chamber of the semiconductor substrate processing apparatus, (b) adjusting tilt of a showerhead of the semiconductor substrate processing apparatus using three showerhead tilt adjustment mechanisms configured to provide coarse and fine IPD adjustments wherein each of the showerhead tilt adjustment mechanisms comprises a lock screw, a hollow screw, a lock plate and a lock nut arranged to vary a gap between a movable part attached to the showerhead and a fixed part in the processing chamber, (c) wherein the hollow screw has a first threaded section on an outer surface thereof and a second threaded section on the outer surface, the first threaded section having a thread pitch which is different than a thread pitch of the second threaded section, the first threaded section engaged with an internally threaded bore of the movable part, and the second threaded section engaged with an internal thread of the locking nut, (d) the lock screw has a lower end threaded into a bore in the fixed part and an upper screw head engaging a shoulder of an upper socket in the hollow screw; and (e) the lock plate is movable from a first position at which the lock nut rotates with the hollow screw to a second position at which the lock nut cannot rotate, the showerhead tilt adjustment mechanism providing coarse adjustment when the lock plate is in the first position and fine adjustment when the lock plate is in the second position. In making a coarse adjustment, the lock plate of one of the showerhead tilt adjustment mechanisms can be placed in the first position and the hollow screw can be rotated to a first radial position. In making a fine adjustment, the lock plate can be moved to the second position and the hollow screw can be rotated to a second radial position at which the IPD is reduced. The upper socket of the hollow screw can include a slot extending through a wall of the socket and the method can further comprise placing an indicator cap having an upper alignment mark onto the hollow screw such that a projection on the indicator cap fits within the slot, recording a pre-adjustment angle of alignment mark, removing the indicator cap and making the IPD adjustment, placing the indicator cap on the hollow screw and recording a post-adjustment angle of the alignment mark. By using first and second threaded sections having the same orientation, each of the showerhead tilt adjustment mechanisms can provide a coarse gap adjustment of about 0.02 to about 0.04 inch per full rotation of the hollow screw when the lock plate is in the first position and a fine gap adjustment of about 0.002 to about 0.004 inch per full rotation of the hollow screw when the lock plate is in the second position.

BRIEF DESCRIPTION OF THE DRAWING FIGURES

Figure 4A:
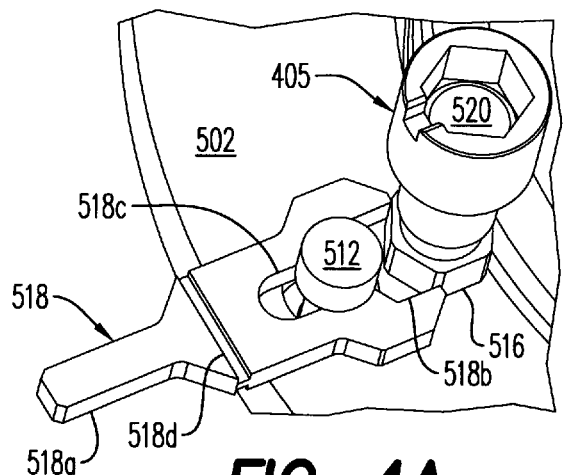
Figure 4B:
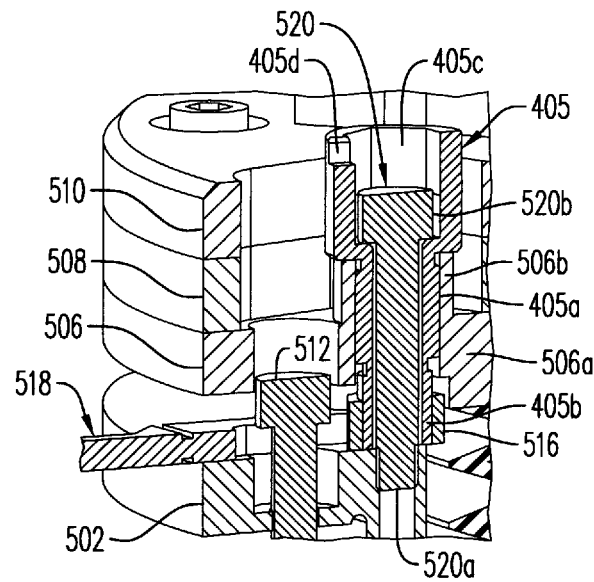
Figure 4C:
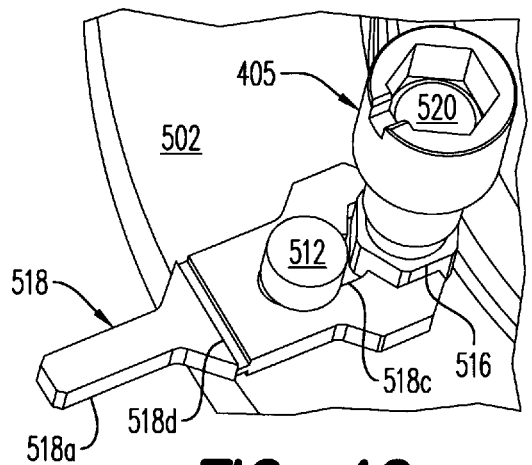
Figure 4D:
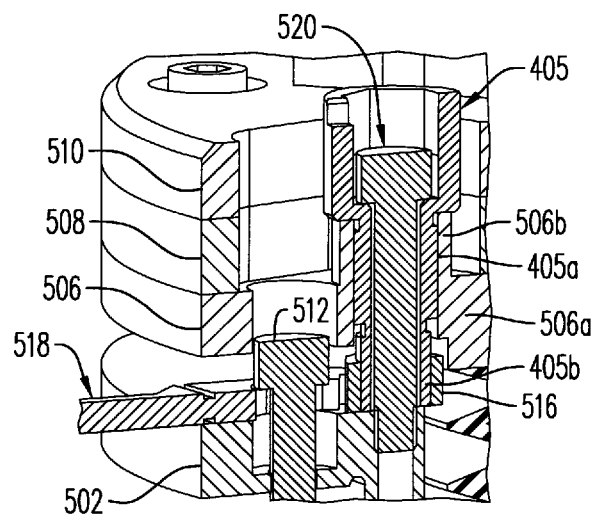

FIGS. 4A-D illustrate gap tuning arrangements wherein FIGS. 4A-B show how coarse tuning is carried out with the lock plate not engaged with a lock nut and FIGS. 4C-D show how fine tuning is carried out with the lock plate engaged with the lock nut in accordance with embodiments disclosed herein.

Figure 5:
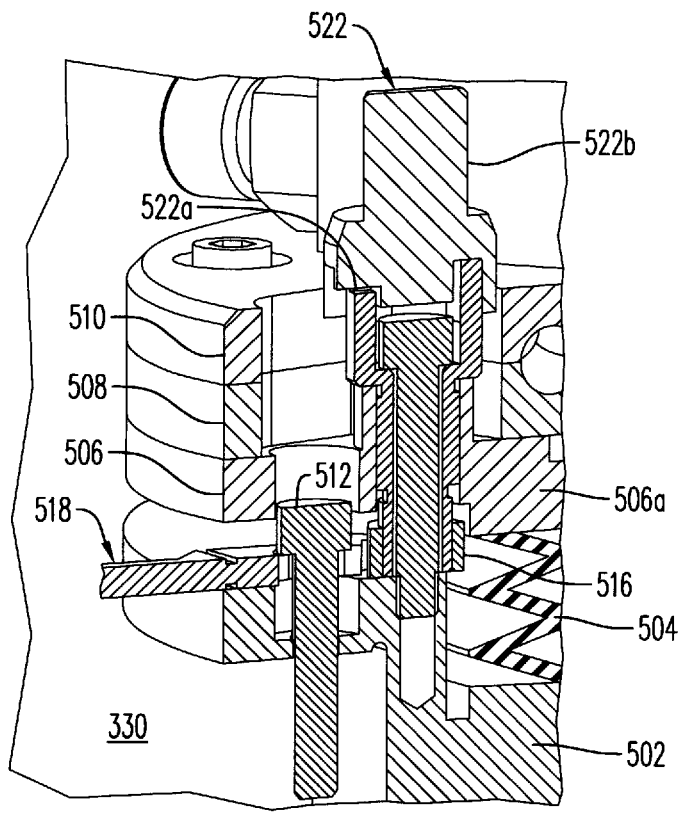

FIG. 5 illustrates how an indicator cap fits on the hollow adjustment screw in accordance with an embodiment disclosed herein.

Figure 6:
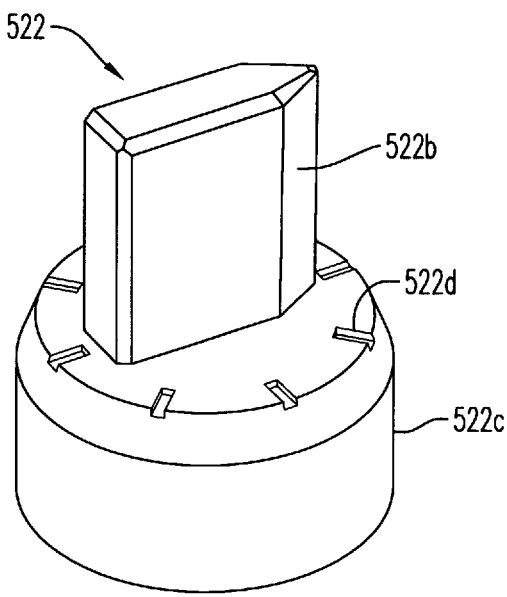

FIG. 6 illustrates an indicator cap which mounts on a hollow adjustment screw for indicating an angle of rotation after a gap adjustment.

DETAILED DESCRIPTION

In the following detailed description, numerous specific embodiments are set forth in order to provide a thorough understanding of the apparatus and methods disclosed herein. However, as will be apparent to those skilled in the art, the present embodiments may be practiced without these specific details or by using alternate elements or processes. In other instances, well-known processes, procedures, and/ or components have not been described in detail so as not to unnecessarily obscure aspects of embodiments disclosed herein. As used herein in connection with numerical values the term "about" refers to ±10%.

As indicated, present embodiments provide semiconductor substrate processing apparatuses such as deposition apparatuses (or in an alternate embodiment an etching apparatus) and associated methods for conducting a chemical vapor deposition such as a plasma enhanced chemical vapor deposition. The apparatus and methods are particularly applicable for use in conjunction with semiconductor fabrication based dielectric deposition processes or metal deposition processes which require separation of self-limiting deposition steps in a multi-step deposition process (e.g., atomic layer deposition (ALD), plasma enhanced atomic layer deposition (PEALD), plasma enhanced chemical vapor deposition (PECVD), pulsed deposition layer (PDL), molecular layer deposition (MLD), or plasma enhanced pulsed deposition layer (PEPDL) processing), however they are not so limited. Exemplary embodiments of methods of processing a semiconductor substrate can be found in commonly-assigned U.S. Published Patent Application Nos. 2013/0230987, 2013/0005140, 2013/0319329, and U.S. Pat. Nos. 8,580,697, 8,431,033, and 8,557,712, which are hereby incorporated by reference in their entirety.

The aforementioned processes can suffer from some drawbacks associated with non-uniform process gas delivery to an upper surface of a wafer or semiconductor substrate receiving deposited films from process gas such as a process gas precursor or reactant. For example, a non-uniform precursor distribution on the upper surface of the semiconductor substrate can form if a lower surface of a showerhead module which delivers process gas to the semiconductor substrate is not parallel to an upper surface of a substrate pedestal module which supports the semiconductor substrate. Several properties of film on wafer are impacted by the gap/leveling between showerhead and pedestal, i.e. IPD, NU %, Stress, etc. The sensitivity between these properties and the gap/leveling are different for different process. And sometimes, the normal resolution is not workable. To address this problem, an improved leveling process is described herein wherein extra fine resolution of a gap adjustment can be provided in a film deposition apparatus.

There are generally two main types of CVD showerhead modules: the chandelier type and the flush mount type. The chandelier showerhead modules have a stem attached to a top plate of the reaction chamber on one end and a faceplate on the other end, resembling a chandelier. A part of the stem may protrude above the top plate to enable connection of gas lines and connection to a radio frequency ("RF") power circuit. Flush mount showerhead modules are integrated into the top of a chamber and do not have a stem. Although the examples shown herein are of a chandelier type showerhead, the showerhead module is not limited to that type of showerhead.

Showerhead module leveling (planarization) is typically performed after a wet clean procedure that involves cooling and venting a reaction chamber (chemical isolation chamber) of the apparatus one or multiple times. The cooling and venting may be required to access the interior of the chamber to adjust the spacing between the showerhead and the substrate pedestal module as well as the planarization of a lower surface of the showerhead with respect to an upper surface of the pedestal module. A conventional technique involves placing metallic foil balls in the chamber to measure the gap between the showerhead module and the substrate pedestal module and then adjusting a number of standoffs, usually three or more, between a backing plate of the showerhead module and the top plate of the reaction chamber based on the measurements. The standoffs can only be adjusted by opening the top plate after venting and cooling the chamber. Multiple measuring and adjusting cycles may be performed before the showerhead module is considered level. Because the showerhead cannot be leveled through external manipulation, the process can be very time-consuming, up to about 20 hours.

In an embodiment, a gap adjustment is performed with screws having differential threads. In this application, a screw and two nuts are used. The screw has two threads with a different but close pitch. Each nut has one pitch that matches the screw. With two pairs of threads, the final pitch is the difference/sum of the two pitches of the two pairs of threads. When the two threads are in the same orientation, they can provide fine resolution. On the other hand, when the two threads are in opposite orientation, they can provide extra course resolution. By fixing both nuts, abnormal resolution can be obtained, and by fixing only one nut and leaving the other one free to rotate, normal resolution is available. Thus, using the differential threads, the showerhead to wafer/pedestal gap and other gaps can be adjusted with much finer/coarser resolution compared with the normal gap tuning method. And with this method, the gap can also be adjusted with the normal resolution. In this way, the gap can be tuned more precisely or faster. Thus, the showerhead to wafer/pedestal gap can be tuned more precisely, which has a large impact on IPD/NU %/etc. of film on wafers.

In accordance with an embodiment, differential threads are used to adjust the showerhead to wafer/pedestal gap. In this way, extra fine/coarse resolution can be provided. In the showerhead module, an extra nut can be added without changing the mounting plate and thereby provide a more retrofitable/cost saving tilt adjustment arrangement. As an example, when the two threads on the screw are in the same orientation, extra fine resolution is available, and when they are in the opposite orientations, extra coarse resolution is available. In another arrangement, final resolution can be modified by changing the resolution of the two threads. Due to space constraints in working on the tool, a tiny wrench can be used to handle the extra nut and thus avoid the need for a specially designed wrench/tool. The tiny wrench can be fixed with an available screw in the existing assembly and avoid the need to manually handle the wrench during tuning. If desired, the wrench can be movable (wrench lock the extra nut or free the extra nut), so the tuning can be changed between abnormal resolution and normal resolution. As a visual aid during tilt adjustment, a mark on the wrench can be used to indicate of its position, i.e., locking or free position. Also, a cap with compass mark can be used to mate with the screw head in a single orientation. This cap is removable and before and after each tuning, a mark can be made on the cap relative to a certain orientation. Then, the angle between the two marks before and after the tuning can be measured to determine a turned angle. In this way, no auto gapping system ("AGS") wafer measurement is required for this application which can save a great amount of time. A discussion of AGS wafer measurements can be found in commonly-assigned U.S. Published Patent Application No. 2015/0225854, the disclosure of which is hereby incorporated by reference.

Disclosed herein is a showerhead module coupled to a showerhead tilt adjustment mechanism, which is designed to be leveled from outside of the reaction chamber, between process steps on the same wafer. In processes where two or more different film materials are deposited sequentially, dynamically adjusting showerhead tilt corrects for azimuthal variation without breaking vacuum. The showerhead tilt adjustment mechanism includes the differential screw tuning arrangement described above.

also described herein is a method of controlling in-plane distortion (IPD) due to showerhead tilt in a semiconductor substrate processing apparatus. The method includes measuring IPD changes across a wafer processed in a processing chamber of the semiconductor substrate processing apparatus and adjusting tilt of a showerhead of the semiconductor substrate processing apparatus using three showerhead tilt adjustment mechanisms having the differential screw tuning arrangement described above which provide coarse and fine IPD adjustments.

Figure 1:
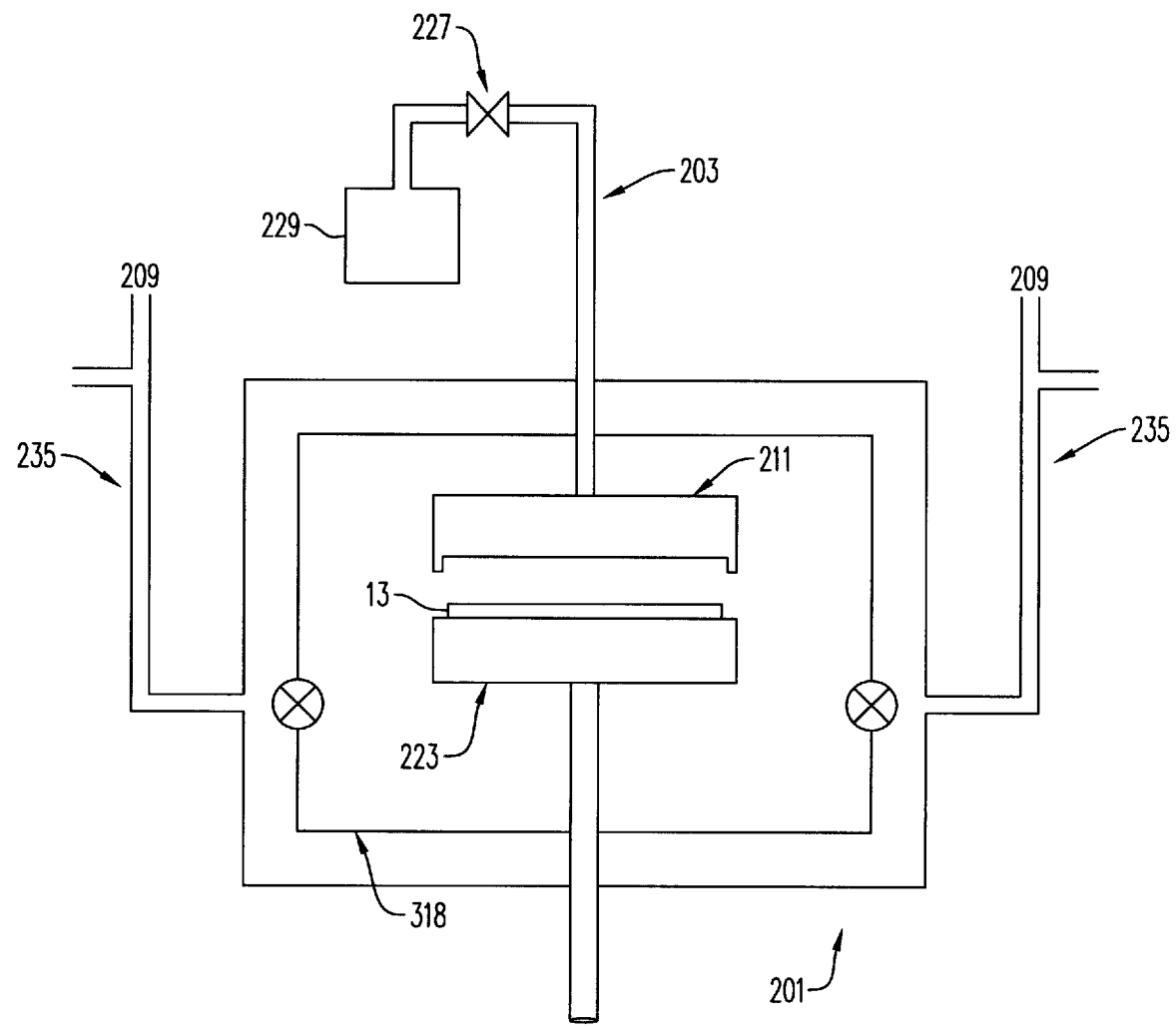
FIG. 1 illustrates a schematic diagram showing an overview of a chemical deposition apparatus in accordance with embodiments disclosed herein.

FIG. 1 is a schematic diagram showing an overview of a semiconductor substrate processing apparatus 201 for chemical vapor deposition in accordance with embodiments disclosed herein. A semiconductor substrate 13 such as a wafer sits on top of a movable pedestal module 223 that can be raised or lowered relative to a showerhead module 211, which may also be moved vertically. Reactant material gases are introduced into a processing zone 318 of the chamber via gas line 203 wherein the process gas flow is controlled by a mass flow controller 229. Note that the apparatus may be modified to have one or more gas lines, depending on the number of reactant gases used. The chamber is evacuated through vacuum lines 235 that are connected to a vacuum source 209. The vacuum source may be a vacuum pump.

Figure 2:
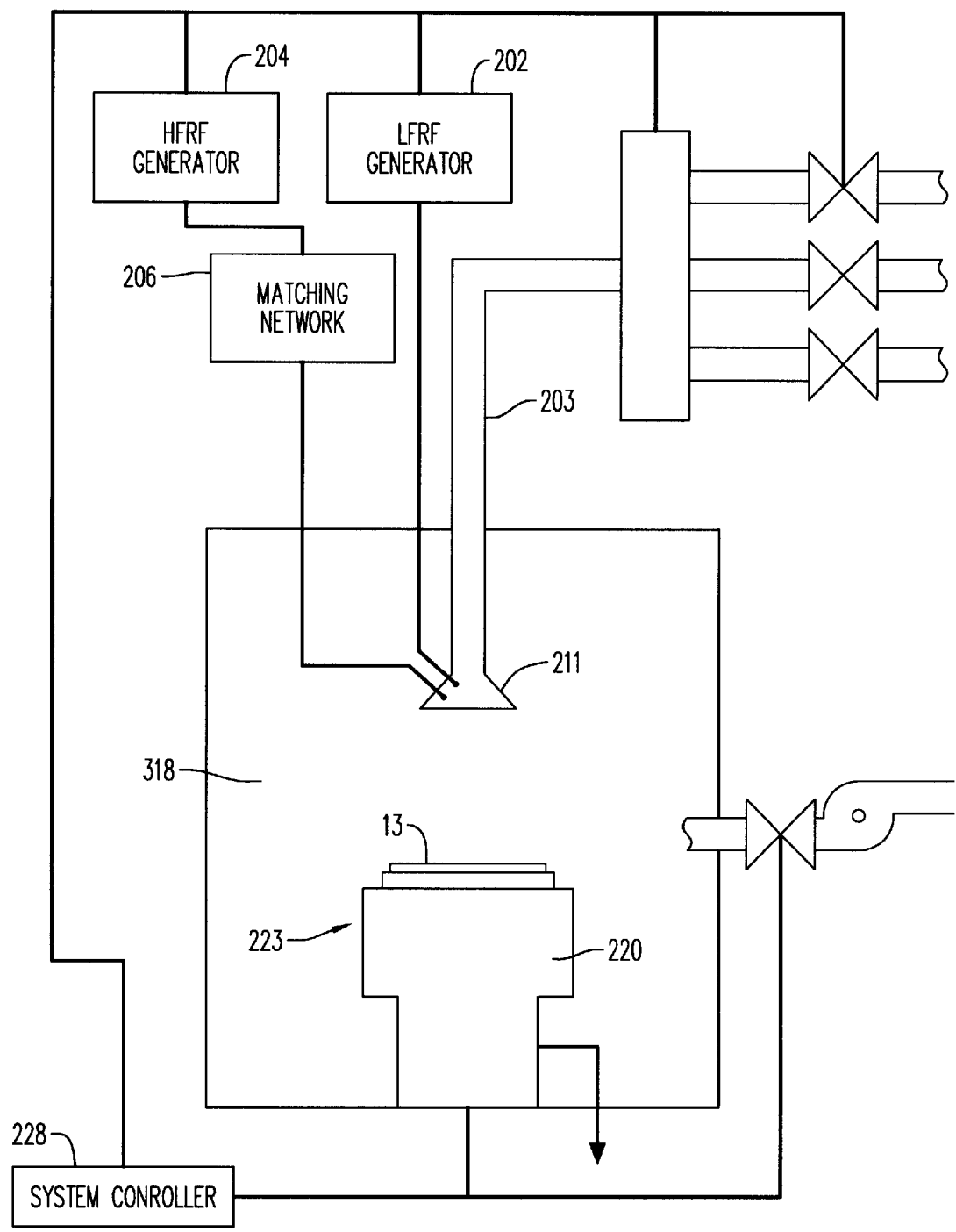
FIG. 2 illustrates a block diagram depicting various apparatus components arranged for implementing embodiments disclosed herein wherein plasma can be utilized to enhance deposition and/or surface reactions between reacting species during the generation of thin films.

Embodiments disclosed herein can be implemented in a plasma enhanced chemical deposition apparatus (i.e. plasma-enhanced chemical vapor deposition (PECVD) apparatus, plasma-enhanced atomic layer deposition (PEALD) apparatus, or plasma-enhanced pulsed deposition layer (PEPDL) apparatus). FIG. 2 provides a simple block diagram depicting various apparatus components arranged for implementing embodiments disclosed herein wherein plasma is utilized to enhance deposition. As shown, a processing zone 318 serves to contain the plasma generated by a capacitively coupled plasma system including a showerhead module 211 working in conjunction with a substrate pedestal module 223, wherein the substrate pedestal module 223 is heated. RF source(s), such as at least one high-frequency (HF) RF generator 204, connected to a matching network 206, and an optional low-frequency (LF) RF generator 202 are connected to the showerhead module 211. In an alternative embodiment, the HF generator 204 can be connected to the substrate pedestal module 223. The power and frequency supplied by matching network 206 is sufficient to generate a plasma from the process gas/vapor. In an embodiment both the HF generator and the LF generator are used, and in an alternate embodiment, just the HF generator is used. In a typical process, the HF generator is operated at frequencies of about 2-100 MHz; in a preferred embodiment at 13.56 MHz or 27 MHz. The LF generator is operated at about 50 kHz to 2 MHz; in a preferred embodiment at about 350 to 600 kHz. The process parameters may be scaled based on the chamber volume, substrate size, and other factors. Similarly, the flow rates of process gas may depend on the free volume of the vacuum chamber (reaction chamber) or processing zone.

Within the chamber, the substrate pedestal module 223 supports a substrate 13 on which materials such as thin films may be deposited. The substrate pedestal module 223 can include a fork or lift pins to hold and transfer the substrate during and between the deposition and/or plasma treatment reactions. In an embodiment, the substrate 13 may be configured to rest on a surface of the substrate pedestal module 223, however in alternate embodiments the substrate pedestal module 223 may include an electrostatic chuck, a mechanical chuck, or a vacuum chuck for holding the substrate 13 on the surface of the substrate pedestal module 223. The substrate pedestal module 223 can be coupled with a heater block 220 for heating substrate 13 to a desired temperature. Substrate 13 is maintained at a temperature of about 25° C. to 500° C. or greater depending on the material to be deposited.

In certain embodiments, a system controller 228 is employed to control process conditions during deposition, post deposition treatments, and/or other process operations. The controller 228 will typically include one or more memory devices and one or more processors. The processor may include a CPU or computer, analog and/or digital input/output connections, stepper motor controller boards, etc.

In certain embodiments, the controller 228 controls all of the activities of the apparatus. The system controller 228 executes system control software including sets of instructions for controlling the timing of the processing operations, frequency and power of operations of the LF generator 202 and the HF generator 204, flow rates and temperatures of precursors and inert gases and their relative mixing, temperature of the heater block 220 and showerhead module 211, pressure of the chamber, tilt of the showerhead, and other parameters of a particular process. Other computer programs stored on memory devices associated with the controller may be employed in some embodiments.

Typically there will be a user interface associated with controller 228. The user interface may include a display screen, graphical software displays of the apparatus and/or process conditions, and user input devices such as pointing devices, keyboards, touch screens, microphones, etc.

A non-transitory computer machine-readable medium can comprise program instructions for control of the apparatus. The computer program code for controlling the processing operations can be written in any conventional computer readable programming language: for example, assembly language, C, C++, Pascal, Fortran or others. Compiled object code or script is executed by the processor to perform the tasks identified in the program.

The controller parameters relate to process conditions such as, for example, timing of the processing steps, flow rates and temperatures of precursors and inert gases, temperature of the wafer, pressure of the chamber, tilt of the showerhead, and other parameters of a particular process. These parameters are provided to the user in the form of a recipe, and may be entered utilizing the user interface.

Signals for monitoring the process may be provided by analog and/or digital input connections of the system controller. The signals for controlling the process are output on the analog and digital output connections of the apparatus.

The system software may be designed or configured in many different ways. For example, various chamber component subroutines or control objects may be written to control operation of the chamber components necessary to carry out deposition processes. Examples of programs or sections of programs for this purpose include substrate timing of the processing steps code, flow rates and temperatures of precursors and inert gases code, and a code for pressure of the chamber.

The showerhead module 211 is preferably temperature controlled and the pedestal is preferably RF powered. An exemplary embodiment of a temperature controlled RF powered showerhead module can be found in commonly-assigned U.S. Published Patent Application No. 2013/0316094 which is hereby incorporated by reference in its entirety.

Figure 3A:
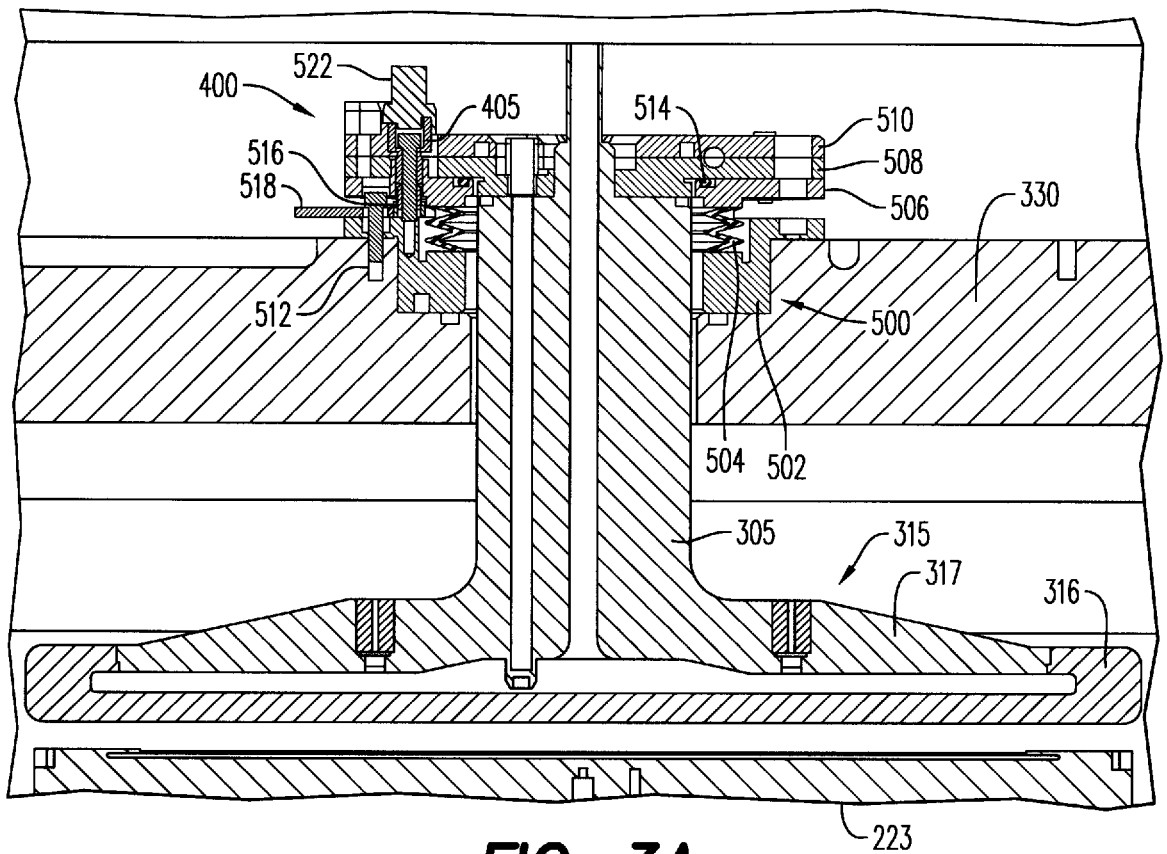
FIG. 3A illustrates a cross-section and FIG. 3B illustrates a top view of a showerhead module arranged in accordance with embodiments disclosed herein.
Figure 3B:
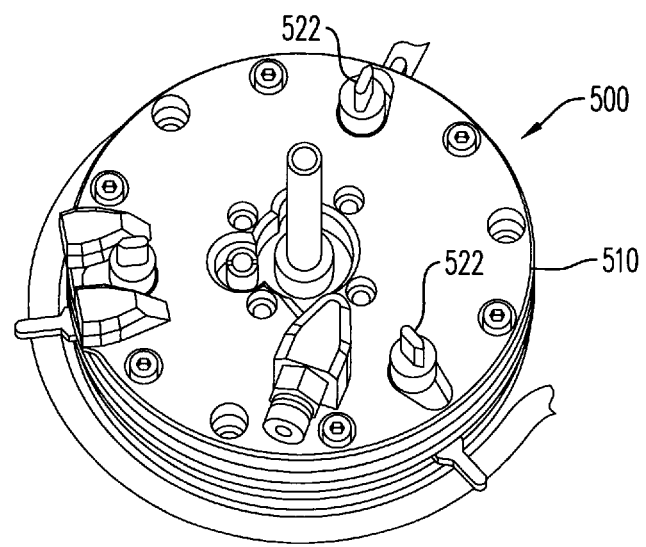

According to embodiments disclosed herein, the showerhead module preferably includes a showerhead tilt adjustment mechanism for manually adjusting tilt, angle, gap and planarization of the showerhead module. As illustrated in FIGS. 3A and 3B, a showerhead module 211 preferably includes a stem 305, a base 315 which includes a backing plate 317 and a faceplate 316 as well as the showerhead tilt adjustment mechanism 400 for adjusting the planarization of the showerhead module 211. The planarization of the showerhead module 211 can also be coarsely adjusted by tightening or loosening three adjustment screws 405 located 120° apart. Adjustment screws 405 comprise a coarse thread and a fine thread that can be used to manually adjust the showerhead module 211 in tilt and in axial position. The adjustment screws 405 mate with lock nuts and threaded bores in a leveling plate as explained in more detail below.

In one embodiment, planarization of the faceplate 316 of the showerhead module 211 can be adjusted using three tilt adjustment mechanisms as part of a showerhead adjustment mechanism to manually provide three degrees of freedom: an axial translation and two directions of tilt. With reference to FIGS. 3A and 3B, the showerhead module 211 is supported by a bellows assembly 500 which includes a collar 502, bellows 504 and leveling plate 506. A cooling plate 508 can be attached to the leveling plate 506.

As illustrated in FIG. 3A, the showerhead module 211 is preferably supported in a top plate 330 of the chemical isolation chamber (i.e. reaction chamber). The top plate 330 preferably supports the collar 502 in a stepped bore. A horizontal upper surface of the top plate 330 preferably has openings, such as threaded openings, wherein corresponding openings, for receiving fasteners 512, in the collar 502 include at least three fasteners 512 which attach the collar 502 to the top plate 330. The collar 502 supports the remainder of showerhead tilt adjustment mechanism 400 in the top plate 330. The showerhead tilt adjustment mechanism 400 is electrically grounded by the top plate 330.

An O-ring 514 forms an airtight seal (i.e. a hermetic seal) between the leveling plate 506 and the cooling plate 508 supported above the collar 502 by three adjustment screws 405 wherein the three adjustment screws 405 are also operable to coarsely adjust the planarization of the cooling plate 508 with respect to the collar 502. As explained in more detail below, an upper end of each adjustment screw 405 is threaded into a threaded bore of the leveling plate 506 and a lower end of each respective adjustment screw 405 is threaded into a lock nut 516 which is free to rotate with the adjustment screw 405 when not engaged with lock plate 518 or the lock nut 516 can be locked by engagement with the lock plate 518 so as not to rotate when the adjustment screw 405 is rotated. The showerhead stem 305 extends through a central opening in the collar 502, the bellows 504, and the leveling plate 506 and an upper end of the stem 305 is attached to the leveling plate 506 so that the faceplate 316 can be tilted to a desired angle by rotation of the adjustment screws 405.

The bellows 504 preferably forms an airtight expandable and flexible vacuum seal between the collar 502 and the leveling plate 506 wherein the stem 305 extends through the airtight expandable vacuum seal such that the planarization of the showerhead module 211 can be adjusted without breaking the airtight expandable vacuum seal. The bellows 504 is preferably welded at an upper end to the leveling plate 506 and at a lower end to the collar 502.

The showerhead tilt adjustment mechanism 400 may be attached to the top plate 330 of a chemical isolation chamber via three or more fasteners 512. The showerhead tilt adjustment mechanism preferably includes three differential screw assemblies wherein each differential screw assembly provides one degree of motion. Three differential screw assemblies would give three degrees of motion: two tilts and axial position.

FIGS. 4A-4D show further details of the showerhead tilt adjustment mechanism and how the showerhead tilt mechanism can provide coarse and fine gap adjustments. The adjustment screw 405 includes a first externally threaded section 405a engaged with an internally threaded section 506a in an upwardly extending tubular projection 506b on the leveling plate 506 and a second externally threaded section 405b engaged with internal threads of the lock screw 516. The first threaded section 405a and the second threaded section 405b preferably have different thread pitches oriented in the same direction. The upper end of the adjustment screw 405 includes a socket 405c which can engage a tool such as a hexagonal screw driver (not shown) and a slot 405d in an upper portion of the socket 405c is adapted to receive a projection of an indicator cap. A fastener 520 such as a bolt is located inside the adjustment screw 405 with a lower end 520a threaded into a threaded hole in the collar 502 and an enlarged head 520b at the upper end received inside the socket 405c. the head 520b fills a lower portion of the socket 405c so that a tool such as a hexagonal screw driver can engage the remainder of the socket 405c to rotate the adjustment screw 405 during a gap/tilt adjustment.

The lock plate 518 includes a handle 518a at one end, a wide slot 518b at the opposite end, and a narrow slot 518c extending from the wide slot 518b. The shaft of fastener 512 extends through the narrow slot 518c and allows the lock plate 518 to slide radially inwardly to engage the lock nut 516. As shown in FIGS. 4A-4B, when the lock plate 518 is not engaged with the lock nut 516, the lock nut 516 rotates with the adjustment screw 405 to provide a coarse gap adjustment. As shown in FIGS. 4C-4D, when the lock plate 518 is engaged with the lock nut 516, the lock nut 516 is prevented from rotating with the adjustment screw 405 to provide a fine gap adjustment. The lock plate 518 includes a reference mark 518d which provides a visual indication of when the lock plate 518 is not engaged with the lock nut 516 (reference mark 518d is outside the outer periphery of leveling plate 506 as shown in FIGS. 4A-4B) and when the lock plate 518 is engaged with the lock nut 516 (reference mark 518d is inside the outer periphery of the leveling plate 506 as shown in FIGS. 4C-4D).

FIG. 5 shows details of an indicator cap 522 fitted in the socket 405c of the adjustment screw 405. The indicator cap 522 includes a projection 522a which fits in the slot 405d of the adjustment screw 405. In making a gap/tilt adjustment, the indicator cap 522 can be placed on the adjustment screw 405 and its angular position can be recorded. Then, the indicator cap is removed and a gap/tilt adjustment is performed by rotating the adjustment screw 405 with the lock nut 516 not engaged with the lock plate 518 or with the lock nut 516 engaged with the lock plate 518. When the gap/tilt adjustment is completed, the indicator cap is placed on the adjustment screw 405 and its angular position is recorded.

As shown in FIG. 6, the indicator cap can include a pointer 522b extending upwardly from a circular dial 522c having indicator circumferentially spaced marks 522d which provide a visual indication of the angular position of the pointer before and after a gap/tilt adjustment.

The adjustment screw 405 may also be used for coarse and fine adjustment of the showerhead module 211 position. Depending on the choice of thread pitches, coarse adjustments in the range of about 0.02 to about 0.04 inch and fine adjustments in the range of about 0.002 to 0.004 inch per full rotation of the adjustment screw 405 can be achieved. For example, the coarse adjustment can be 0.03125 inch per full rotation of the adjustment screw and the fine adjustment can be 0.0035 inch per full rotation of the adjustment screw.

While the semiconductor substrate processing apparatus including the baffle arrangement has been described in detail with reference to specific embodiments thereof, it will be apparent to those skilled in the art that various changes and modifications can be made, and equivalents employed, without departing from the scope of the appended claims.

What is claimed is:

1. A semiconductor substrate processing apparatus for processing semiconductor substrates comprising:
 a chemical isolation chamber in which individual semiconductor substrates are processed, the chemical isolation chamber including a top plate forming an upper wall of the chemical isolation chamber;
 a process gas source in fluid communication with the chemical isolation chamber for supplying at least one process gas into the chemical isolation chamber;
 a showerhead module which delivers the process gas from the process gas source to a processing zone of the processing apparatus wherein the individual semiconductor substrates are processed, the showerhead module including a base attached to a lower end of a stem wherein a faceplate having gas passages therethrough forms a lower surface of the base and the stem extends through a vertically extending bore in the top plate;
 a substrate pedestal module configured to support the semiconductor substrate in the processing zone below the faceplate during processing of the substrate;
 a bellows assembly supporting the showerhead module, the bellows assembly including a collar, a bellows and a leveling plate, the collar having a central opening aligned with the bore in the top plate, the bellows surrounding the central opening in the collar and having a lower end attached to an upper surface of the collar and an upper end attached to a lower surface of the leveling plate, the leveling plate having a central opening aligned with the bore in the top plate;
 at least one showerhead tilt adjustment mechanism operable to adjust tilting of the faceplate of the showerhead module with respect to an upper surface of the substrate pedestal module adjacent the faceplate, wherein the showerhead tilt adjustment mechanism comprises a hollow screw, a lock plate, and a lock nut, the hollow screw having a first threaded section and a second threaded section, the first threaded section having a thread pitch which is different than a thread pitch of the second threaded section, the first threaded section engaged with the leveling plate, the second threaded section engaged with the lock nut, and the lock plate movable from a first position at which the lock nut rotates with the hollow screw to a second position at which the lock nut cannot rotate, the showerhead tilt adjustment mechanism providing coarse adjustment when the lock plate is in the first position and fine adjustment when the lock plate is in the second position.

2. The semiconductor substrate processing apparatus of claim 1, wherein the at least one showerhead tilt adjustment mechanism comprises three showerhead tilt adjustment mechanisms spaced outwardly of the bellows at locations 120° apart.

3. The semiconductor substrate processing apparatus of claim 1, wherein the lock plate is movable in a radial direction between the first and second positions.

4. The semiconductor substrate processing apparatus of claim 1, wherein the leveling plate includes a threaded section engaging the hollow screw.

5. The semiconductor substrate processing apparatus of claim 1, wherein the lock plate includes a handle at an outer end thereof extending outwardly of the collar, a wide slot at an inner end thereof which can engage the lock nut, and a narrow slot extending outward from the wide slot, and a lock plate screw extending through the narrow slot and threaded into the collar, the lock plate screw having a screw head which can be tightened against the lock plate to prevent movement of the lock plate.

6. The semiconductor substrate processing apparatus of claim 1, wherein the showerhead tilt adjustment mechanism can provide a coarse gap adjustment of about 0.02 to about 0.04 inch per full rotation of the hollow screw when the lock plate is in the first position and a fine gap adjustment of about 0.002 to about 0.004 inch per full rotation of the hollow screw when the lock plate is in the second position.

7. A showerhead tilt adjustment mechanism configured to provide coarse and fine gap adjustments of a showerhead module supported in a top plate of a semiconductor substrate processing apparatus by a bellows assembly, wherein the showerhead tilt adjustment mechanism comprises:
   a hollow screw, a lock plate, and a lock nut;
   the hollow screw having a first threaded section and a second threaded section, the first threaded section having a thread pitch which is different than a thread pitch of the second threaded section, the first threaded section configured to engage with a leveling plate of the bellows assembly, the second threaded section engaged with the lock nut;
   the lock plate movable from a first position at which the lock nut rotates with the hollow screw to a second position at which the lock nut cannot rotate, the showerhead tilt adjustment mechanism providing coarse adjustment when the lock plate is in the first position and fine adjustment when the lock plate is in the second position.

8. The showerhead tilt adjustment mechanism of claim 7, wherein the first and second threaded sections on the hollow screw have the same orientation.

9. The showerhead tilt adjustment mechanism of claim 7, wherein the lock plate includes a handle at an outer end thereof, a wide slot at an inner end thereof which can engage the lock nut, and a narrow slot extending outward from the wide slot, the narrow slot configured to receive a lock plate screw threaded into the collar, the lock plate screw having a screw head which can be tightened against the lock plate to prevent movement of the lock plate.

10. The showerhead tilt adjustment mechanism of claim 7, wherein the showerhead tilt adjustment mechanism can provide a coarse gap adjustment of about 0.02 to about 0.04 inch per full rotation of the hollow screw when the lock plate is in the first position and a fine gap adjustment of about 0.002 to about 0.004 inch per full rotation of the hollow screw when the lock plate is in the second position.

11. A showerhead module which delivers process gas from a process gas source to a processing zone of a semiconductor substrate processing apparatus wherein individual semiconductor substrates are processed, the showerhead module comprising:
   a base attached to a lower end of a stem wherein a faceplate having gas passages therethrough forms a lower surface of the base and the stem is configured to extend through a vertically extending bore in a top plate of the processing apparatus;
   a bellows assembly supporting the showerhead module, the bellows assembly including a collar, a bellows and a leveling plate, the collar having a central opening aligned with the bore in the top plate, the bellows surrounding the central opening in the collar and having a lower end attached to an upper surface of the collar and an upper end attached to a lower surface of the leveling plate, the leveling plate having a central opening aligned with the bore in the top plate;
   at least one showerhead tilt adjustment mechanism operable to adjust tilting of the faceplate of the showerhead module, wherein the showerhead tilt adjustment mechanism comprises a hollow screw, a lock plate, and a lock nut, the hollow screw having a first threaded section and a second threaded section, the first threaded section having a thread pitch which is different than a thread pitch of the second threaded section, the first threaded section engaged with the leveling plate, the second threaded section engaged with the lock nut; and the lock plate movable from a first position at which the lock nut rotates with the hollow screw to a second position at which the lock nut cannot rotate; the showerhead tilt adjustment mechanism providing coarse adjustment when the lock plate is in the first position and fine adjustment when the lock plate is in the second position.

12. The showerhead module of claim 11, wherein the at least one showerhead tilt adjustment mechanism comprises three showerhead tilt adjustment mechanisms spaced outwardly of the bellows at locations 120° apart.

13. The showerhead module of claim 11, wherein the lock plate is movable in a radial direction between the first and second positions.

14. The showerhead module of claim 11, wherein the leveling plate includes a threaded section which engages the hollowscrew.

15. The showerhead module of claim 11, wherein the lock plate includes a handle at an outer end thereof extending outwardly of the collar, a wide slot at an inner end thereof which can engage the lock nut, and a narrow slot extending outward from the wide slot, and a lock plate screw extending through the narrow slot and threaded into the collar, the lock plate screw having a screw head which can be tightened against the lock plate to prevent movement of the lock plate.

16. The showerhead module of claim 15, wherein the showerhead tilt adjustment mechanism can provide a coarse gap adjustment of about 0.02 to about 0.04 inch per full rotation of the hollow screw when the lock plate is in the first position and a fine gap adjustment of about 0.002 to about 0.004 inch per full rotation of the hollow screw when the lock plate is in the second position.

17. A method of controlling deposition film properties due to showerhead tilt in a semiconductor substrate processing apparatus, the method comprising:
   measuring deposition film properties of a wafer processed in a processing chamber of the semiconductor substrate processing apparatus;
   adjusting tilt of a showerhead of the semiconductor substrate processing apparatus using three showerhead tilt adjustment mechanisms configured to provide coarse and fine adjustments wherein each of the showerhead tilt adjustment mechanisms comprises a hollow screw, a lock plate and a lock nut arranged to vary a gap between a movable part attached to the showerhead and a fixed part in the processing chamber;

wherein the hollow screw has a first threaded section and a second threaded section, the first threaded section having a thread pitch which is different than a thread pitch of the second threaded section, the first threaded section engaged with the movable part, and the second threaded section engaged with the lock nut; and the lock plate is movable from a first position at which the lock nut rotates with the hollow screw to a second position at which the lock nut cannot rotate, the showerhead tilt adjustment mechanism providing coarse adjustment when the lock plate is in the first position and fine adjustment when the lock plate is in the second position.

18. The method of claim 17, comprising making a coarse adjustment by positioning the lock plate of one of the showerhead tilt adjustment mechanisms in the first position and rotating the hollow screw to a first radial position, and making a fine adjustment by moving the lock plate to the second position and rotating the hollow screw to a second radial position.

19. The method of claim 18, wherein a slot extends through a wall of a socket in the hollow screw, the method further comprising placing an indicator cap having an upper alignment mark onto the hollow screw such that a projection on the indicator cap fits within the slot, recording a pre-adjustment angle of alignment mark, removing the indicator cap and making the deposition film property adjustment, placing the indicator cap on the hollow screw and recording a post-adjustment angle of the alignment mark.

20. The method of claim 17, wherein the first and second threaded sections have the same orientation and each of the showerhead tilt adjustment mechanisms can provide a coarse gap adjustment of about 0.02 to about 0.04 inch per full rotation of the hollow screw when the lock plate is in the first position and a fine gap adjustment of about 0.002 to about 0.004 inch per full rotation of the hollow screw when the lock plate is in the second position.

* * * * *